(12) United States Patent
Van Lier et al.

(10) Patent No.: US 9,360,511 B2
(45) Date of Patent: Jun. 7, 2016

(54) CLOSED LOOP DYNAMIC CAPACITANCE MEASUREMENT

(71) Applicant: QUALCOMM MEMS Technologies, Inc., San Diego, CA (US)

(72) Inventors: Wilhelmus Johannes Robertus Van Lier, San Diego, CA (US); Robert Steven Kawamoto, San Diego, CA (US); James Steven Edgar, San Diego, CA (US); Pramod Kumar Varma, La Jolla, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 126 days.

(21) Appl. No.: 14/245,881

(22) Filed: Apr. 4, 2014

(65) Prior Publication Data

US 2015/0108986 A1        Apr. 23, 2015

Related U.S. Application Data

(60) Provisional application No. 61/893,808, filed on Oct. 21, 2013.

(51) Int. Cl.
*G09G 3/00* (2006.01)
*G01R 27/26* (2006.01)
*G09G 3/34* (2006.01)
*G01D 5/241* (2006.01)

(52) U.S. Cl.
CPC ........... *G01R 27/2605* (2013.01); *G09G 3/3466* (2013.01); *G01D 5/241* (2013.01); *G09G 2320/04* (2013.01)

(58) Field of Classification Search
CPC ..... G09G 3/00; G09G 3/006; G09G 2330/12; G09G 3/3466; G09G 2320/0693; G09G 2320/029; G09G 2320/04; G01R 27/26; G01R 27/2605; G01R 27/08; G01D 5/241; G01B 7/14; G01B 7/023; G06F 3/0418; H03M 3/456; H03M 3/496

See application file for complete search history.

(56) References Cited

U.S. PATENT DOCUMENTS

| 7,714,919 | B2 | 5/2010 | Inoue et al. |
| 7,746,170 | B2 | 6/2010 | Amini et al. |
| 8,134,622 | B2 | 3/2012 | Kobayashi |
| 8,218,051 | B2 | 7/2012 | Krymski |
| 2001/0047689 | A1 | 12/2001 | McIntosh |

(Continued)

FOREIGN PATENT DOCUMENTS

DE    102006055844 A1    6/2007

OTHER PUBLICATIONS

International Search Report and Written Opinion—PCT/US2014/059734—ISA/EPO—Jul. 17, 2015.

*Primary Examiner* — Son Le
(74) *Attorney, Agent, or Firm* — Weaver Austin Villeneuve & Sampson LLP

(57) ABSTRACT

This disclosure provides systems, methods and apparatus for measuring capacitance of a display unit, such as an interferometric modulator (IMOD). In one example, a circuit may include an operational amplifier (op-amp), a voltage controlled current source, and feedback from an output of the op-amp as an input to the voltage controlled current source. An output of the voltage controlled current source may be provided to a display unit as well as an input of the op-amp. A second input of the op-amp may be provided a ramping reference voltage.

19 Claims, 16 Drawing Sheets

(56) References Cited

U.S. PATENT DOCUMENTS

| | | |
|---|---|---|
| 2005/0104003 A1 | 5/2005 | Jarron |
| 2006/0027730 A1* | 2/2006 | Bamji .................. G01S 7/487 250/208.1 |
| 2009/0147343 A1 | 6/2009 | Kogut et al. |
| 2011/0291986 A1* | 12/2011 | Rebeschi ................ G06F 3/044 345/174 |
| 2011/0310079 A1 | 12/2011 | Kim et al. |

* cited by examiner

| | Common Voltages | | | | |
|---|---|---|---|---|---|
| Segment Voltages | | $VC_{ADD\_H}$ | $VC_{HOLD\_H}$ | $VC_{REL}$ | $VC_{HOLD\_L}$ | $VC_{ADD\_L}$ |
| | $VS_H$ | Stable | Stable | Relax | Stable | Actuate |
| | $VS_L$ | Actuate | Stable | Relax | Stable | Stable |

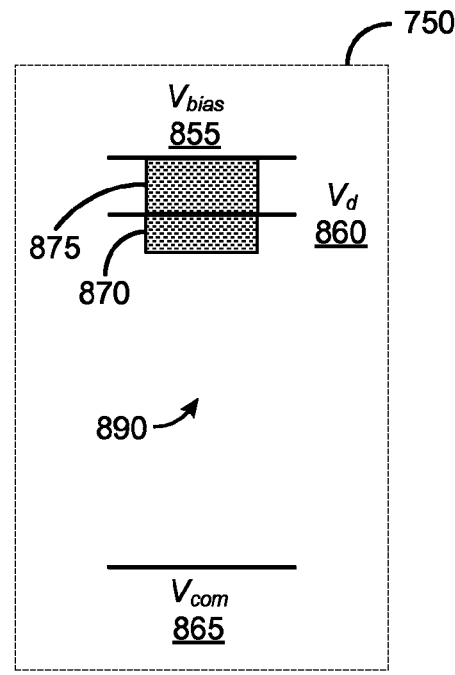
*FIG. 9A*
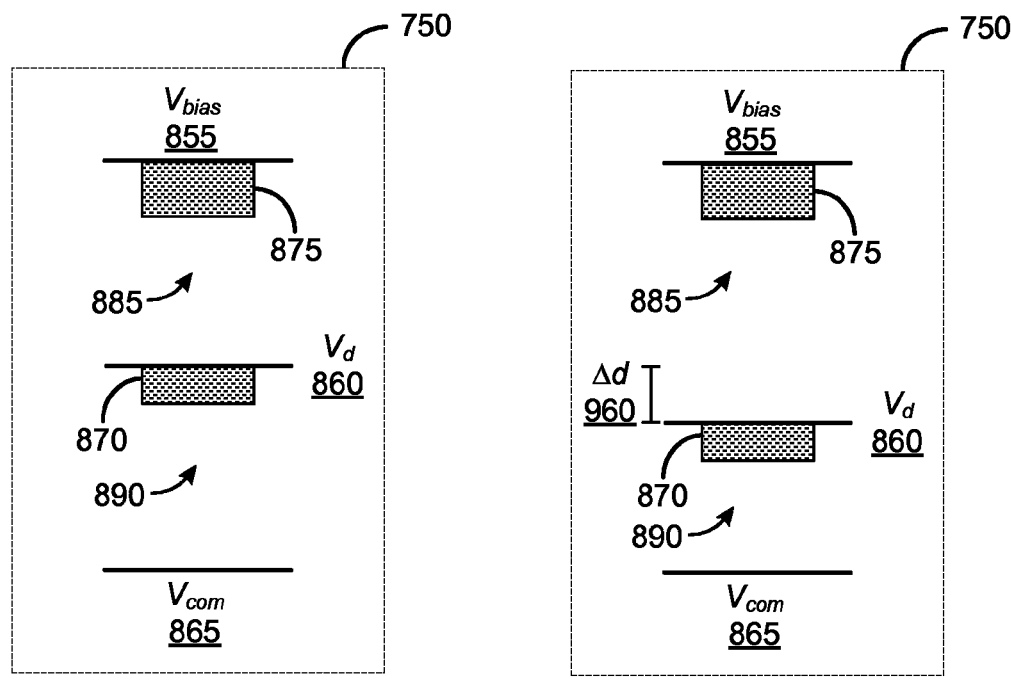
*FIG. 9B*  *FIG. 9C*

CLOSED LOOP DYNAMIC CAPACITANCE MEASUREMENT

PRIORITY DATA

This patent document claims priority to co-pending and commonly assigned U.S. Provisional Patent Application No. 61/893,808, titled "Closed Loop Dynamic Capacitance Measurement", by Van Lier et al., filed on Oct. 21, 2013, which is hereby incorporated by reference in its entirety and for all purposes.

TECHNICAL FIELD

This disclosure relates to electromechanical systems and devices. More specifically, the disclosure relates to determining a capacitance associated with an electromechanical system device, such as an interferometric modulator (IMOD).

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

In some implementations, a movable element of the IMOD may be moved to a particular position from a starting point and under a particular application of voltages to electrodes of the IMOD. However, the movable element of another IMOD may move to a slightly different position from the same starting point and under the same application of voltages. The movable elements may include a mirror which reflects light at a wavelength based on the position of the movable element. Accordingly, the IMODs may reflect light at different wavelengths because the movable elements may be at slightly different positions.

SUMMARY

The systems, methods and devices of this disclosure each have several innovative aspects, no single one of which is solely responsible for the desirable attributes disclosed herein.

One innovative aspect of the subject matter described in this disclosure can be implemented in a circuit including an amplifier having a first input, a second input, and an output, the first input of the amplifier coupled with a voltage reference source; a current source having an input and an output, the input of the current source coupled with the output of the amplifier, the output of the current source coupled with the second input of the amplifier, the current source being voltage controlled; and one or more display units having a first terminal coupled with the second input of the amplifier and with the output of the current source, wherein the current source provides a current based on a voltage associated with the output of the amplifier, the current increasing until a voltage associated with the first terminal of the one or more display units equals a voltage associated with the voltage reference source.

In some implementations, the circuit can include a feedback capacitor having a first terminal and a second terminal, the first terminal of the feedback capacitor coupled with the output of the current source, the second terminal of the feedback capacitor coupled with the output of the amplifier.

In some implementations, a capacitance of the feedback capacitor is less than or equal to a capacitance of the one or more display units.

In some implementations, the circuit can include an analog-to-digital converter having an input coupled with the output of the amplifier.

In some implementations, the one or more display units have a second terminal set to a first fixed voltage.

In some implementations, the one or more display units have a third terminal set to the first fixed voltage.

In some implementations, the one or more display units have a third terminal set to a second fixed voltage.

In some implementations, the first terminal of the display unit is associated with a movable element.

In some implementations, the voltage reference source ramps through a voltage range associated with a travel range of the movable element.

In some implementations, the travel range of the movable element is between a second terminal and a third terminal of the display unit.

In some implementations, the current source has a linear gain.

In some implementations, a movable element associated with the first terminal of the one or more display units is configured to move to positions between a second terminal and a third terminal of the one or more display units until the voltage associated with the first terminal of the display units equals the voltage associated with the voltage reference source.

Another innovative aspect of the subject matter described in this disclosure can be implemented in a system having a measurement circuit including an amplifier having a first input, a second input, and an output, the first input of the amplifier coupled with a voltage reference source, and a current source having an input and an output, the input of the current source coupled with the output of the amplifier, the output of the current source coupled with the second input of the amplifier, the current source being voltage controlled; one or more display units having a first terminal coupled with the second input of the amplifier and with the output of the current source, wherein the current source provides a current based on a voltage associated with the output of the amplifier, the current increasing until a voltage associated with the first terminal of the one or more display units equals a voltage associated with the voltage reference source; an analog-to-digital converter (ADC) having an input coupled with the output of the amplifier, and an output to provide measurement data; and a memory configured to store the measurement data.

In some implementations, a microcontroller can be configured to analyze the measurement data.

Another innovative aspect of the subject matter described in this disclosure can be implemented in a method for determining capacitance of a group of one or more display units. A reference voltage can be ramped. The reference voltage can be associated with a first input of an amplifier, the amplifier having a second input, and an output. A current source can generate a current. The current source can have an input and an output, the input of the current source coupled with the output of the amplifier, the output of the current source coupled with the second input of the amplifier, the current source being voltage controlled. A voltage associated with a first terminal of the group of one or more display units can be provided. The first terminal can be coupled with the second input of the amplifier and with the output of the current source, wherein the current source provides a current based on a voltage associated with the output of the amplifier, the current increasing until the voltage associated with the first terminal of the one or more display units equals a voltage associated with the voltage reference source.

In some implementations, a feedback capacitor has a first terminal coupled with the output of the current source and a second terminal coupled with the output of the amplifier.

In some implementations, a capacitance of the feedback capacitor can be changed based on a number of display units in the group of the one or more display units.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays, organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

FIGS. 9A, 9B, and 9C are examples of a movable element in different positions.

Like reference numbers and designations in the various drawings indicate like elements.

DETAILED DESCRIPTION

Figure 1:
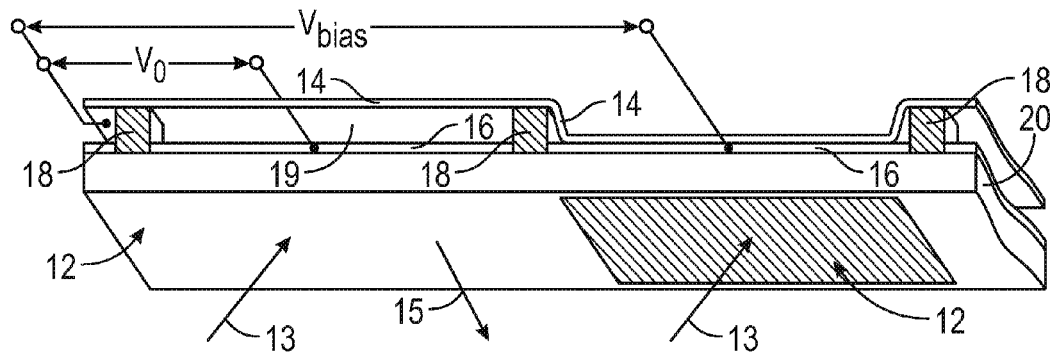
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Interferometric modulator (IMOD) displays may include a movable element with a mirror that can be positioned at various points in order to reflect light at specific wavelengths. In some implementations, the movable element of the IMOD may be moved to a particular position from a starting point and under a particular application of voltages to electrodes of the IMOD. However, the movable element of another IMOD may move to a slightly different position from the same starting point and under the same application of voltages. Some implementations of the subject matter described herein include a closed loop dynamic capacitance measurement circuit to determine a capacitance associated with the IMOD that may provide an indication as to the position of the movable element. Accordingly, an offset to be applied to the voltages needed to move the IMODs to the same position can be determined. In some implementations, the closed loop dynamic capacitance measurement circuit may include an operational amplifier (op-amp) with an output coupled to an input of a voltage controlled current source. The voltage controlled current source may provide a current, based on the voltage provided by the output of the op-amp, to charge one or more IMODs. The output of the voltage controlled current source may also be coupled with an input of the op-amp. A ramping voltage may be provided as a second input of the op-amp. The output of the op-amp may also be coupled with an analog-to-digital converter.

Particular implementations of the subject matter described in this disclosure can be implemented to realize one or more of the following potential advantages. The closed loop dynamic capacitance measurement circuit may provide an indication that the movable element of the IMOD may move to an incorrect position, and therefore, reflect light at an unexpected wavelength. If an IMOD is indicated as deviating from its expected performance, an offset may be provided to the voltages applied to the IMOD such that the movable element may be moved to an expected position, and therefore, reflect light at an expected wavelength. The closed loop dynamic capacitance measurement circuit may also have a low signal-to-noise ratio to measure small changes in capacitance. Moreover, measurements may be obtained by coupling a single terminal of a three-terminal IMOD to the closed loop dynamic capacitance measurement circuit.

An example of a suitable EMS or MEMS device or apparatus, to which the described implementations may apply, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector that is movable with respect to the absorber, and an optical resonant cavity defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
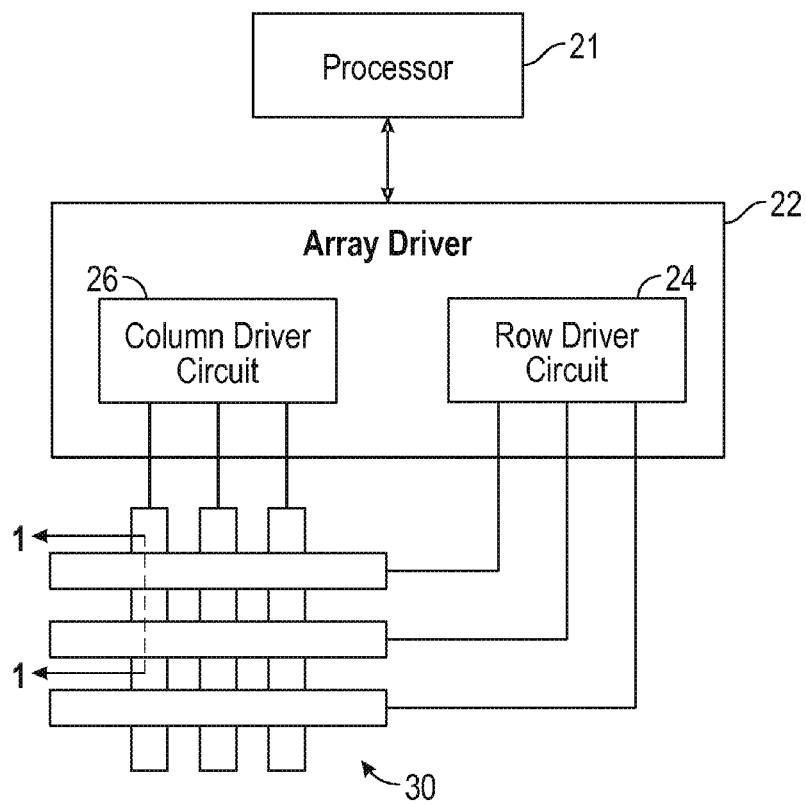
FIG. 2 is a system block diagram illustrating an electronic device incorporating an IMOD-based display including a three element by three element array of IMOD display elements.

FIG. 2 is a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa.

Figures 3, 4:
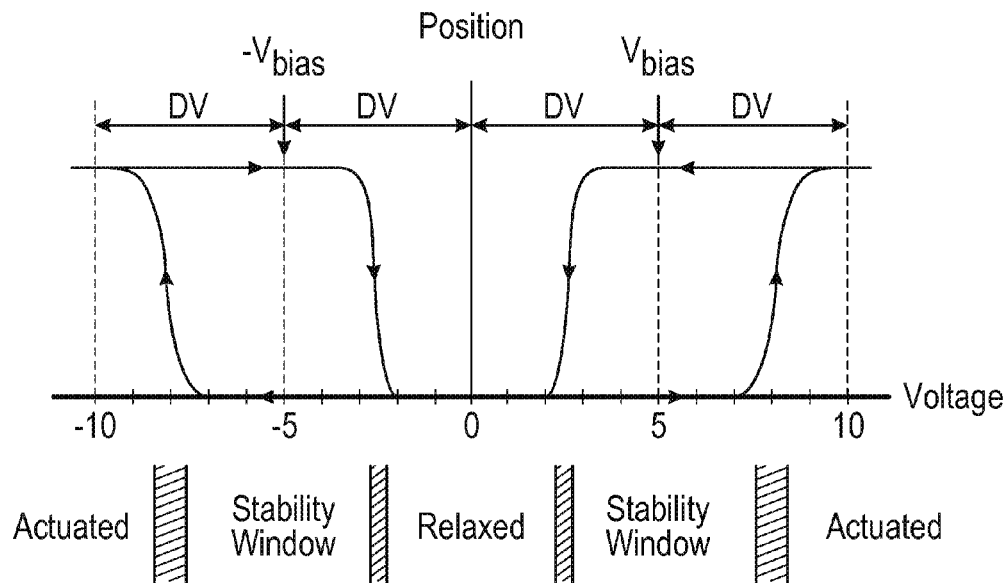
FIG. 3 is a graph illustrating movable reflective layer position versus applied voltage for an IMOD display element.
FIG. 4 is a table illustrating various states of an IMOD display element when various common and segment voltages are applied.

FIG. 3 is a graph illustrating movable reflective layer position versus applied voltage for an IMOD display element. For IMODs, the row/column (i.e., common/segment) write procedure may take advantage of a hysteresis property of the display elements as illustrated in FIG. 3. An IMOD display element may use, in one example implementation, about a 10-volt potential difference to cause the movable reflective layer, or mirror, to change from the relaxed state to the actuated state. When the voltage is reduced from that value, the movable reflective layer maintains its state as the voltage drops back below, in this example, 10 volts, however, the movable reflective layer does not relax completely until the voltage drops below 2 volts. Thus, a range of voltage, approximately 3-7 volts, in the example of FIG. 3, exists where there is a window of applied voltage within which the element is stable in either the relaxed or actuated state. This is referred to herein as the "hysteresis window" or "stability window." For a display array 30 having the hysteresis characteristics of FIG. 3, the row/column write procedure can be designed to address one or more rows at a time. Thus, in this example, during the addressing of a given row, display elements that are to be actuated in the addressed row can be exposed to a voltage difference of about 10 volts, and display elements that are to be relaxed can be exposed to a voltage difference of near zero volts. After addressing, the display elements can be exposed to a steady state or bias voltage difference of approximately 5 volts in this example, such that they remain in the previously strobed, or written, state. In this example, after being addressed, each display element sees a potential difference within the "stability window" of about 3-7 volts. This hysteresis property feature enables the IMOD display element design to remain stable in either an actuated or relaxed pre-existing state under the same applied voltage conditions. Since each IMOD display element, whether in the actuated or relaxed state, can serve as a capacitor formed by the fixed and moving reflective layers, this stable state can be held at a steady voltage within the hysteresis window without substantially consuming or losing power. Moreover, essentially little or no current flows into the display element if the applied voltage potential remains substantially fixed.

In some implementations, a frame of an image may be created by applying data signals in the form of "segment" voltages along the set of column electrodes, in accordance with the desired change (if any) to the state of the display elements in a given row. Each row of the array can be addressed in turn, such that the frame is written one row at a time. To write the desired data to the display elements in a first row, segment voltages corresponding to the desired state of the display elements in the first row can be applied on the column electrodes, and a first row pulse in the form of a specific "common" voltage or signal can be applied to the first row electrode. The set of segment voltages can then be changed to correspond to the desired change (if any) to the state of the display elements in the second row, and a second common voltage can be applied to the second row electrode. In some implementations, the display elements in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each display element (that is, the potential difference across each display element or pixel) determines the resulting state of each display element. FIG. 4 is a table illustrating various states of an IMOD display element when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4, when a release voltage $VC_{REL}$ is applied along a common line, all IMOD display elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator display elements or pixels (alternatively referred to as a display element or pixel voltage) can be within the relaxation window (see FIG. 3, also referred to as a release window) both when the high segment voltage $VS_H$ and the low segment voltage $VS_L$ are applied along the corresponding segment line for that display element.

When a hold voltage is applied on a common line, such as a high hold voltage $VC_{HOLD\_H}$ or a low hold voltage $VC_{HOLD\_L}$, the state of the IMOD display element along that common line will remain constant. For example, a relaxed IMOD display element will remain in a relaxed position, and an actuated IMOD display element will remain in an actuated position. The hold voltages can be selected such that the display element voltage will remain within a stability window both when the high segment voltage $VS_H$ and the low segment voltage $VS_L$ are applied along the corresponding segment line. Thus, the segment voltage swing in this example is the difference between the high $VS_H$ and low segment voltage $VS_L$, and is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that common line by application of segment voltages along the respective segment lines. The segment voltages may be selected such that actuation is dependent upon the segment voltage applied. When an addressing voltage is applied along a common line, application of one segment voltage will result in a display element voltage within a stability window, causing the display element to remain unactuated. In contrast, application of the other segment voltage will result in a display element voltage beyond the stability window, resulting in actuation of the display element. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having substantially no effect (i.e., remaining stable) on the state of the modulator.

In some implementations, hold voltages, address voltages, and segment voltages may be used which produce the same polarity potential difference across the modulators. In some other implementations, signals can be used which alternate the polarity of the potential difference of the modulators from time to time. Alternation of the polarity across the modulators (that is, alternation of the polarity of write procedures) may reduce or inhibit charge accumulation that could occur after repeated write operations of a single polarity.

Figure 5A:
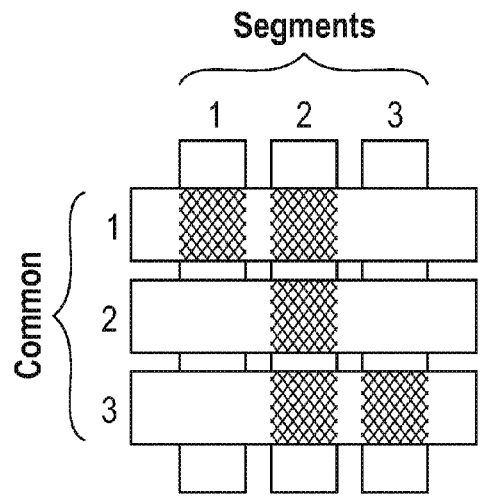
FIG. 5A is an illustration of a frame of display data in a three element by three element array of IMOD display elements displaying an image.
Figure 5B:
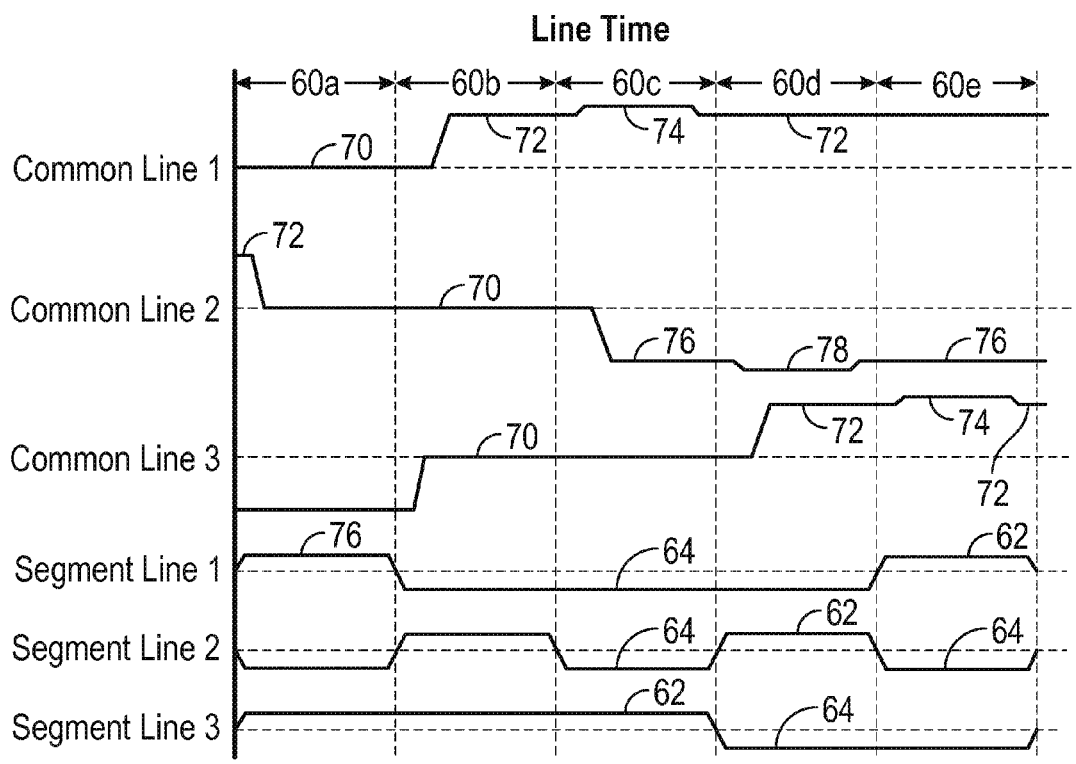
FIG. 5B is a timing diagram for common and segment signals that may be used to write data to the display elements illustrated in FIG. 5A.

FIG. 5A is an illustration of a frame of display data in a three element by three element array of IMOD display elements displaying an image. FIG. 5B is a timing diagram for common and segment signals that may be used to write data to the display elements illustrated in FIG. 5A. The actuated IMOD display elements in FIG. 5A, shown by darkened checkered patterns, are in a dark-state, i.e., where a substantial portion of the reflected light is outside of the visible spectrum so as to result in a dark appearance to, for example, a viewer. Each of the unactuated IMOD display elements reflect a color corresponding to their interferometric cavity gap heights. Prior to writing the frame illustrated in FIG. 5A, the display elements can be in any state, but the write procedure illustrated in the timing diagram of FIG. 5B presumes that each modulator has been released and resides in an unactuated state before the first line time 60a.

During the first line time 60a: a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. In some implementations, the segment voltages applied along segment lines 1,2 and 3 will have no effect on the state of the IMOD display elements, as none of common lines 1,2 or 3 are being exposed to voltage levels causing actuation during line time 60a (i.e., $VC_{REL}$-relax and $VC_{HOLD\_L}$-stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the display element voltage across modulators (1,1) and (1,2) is greater than the high end of the positive stability window (i.e., the voltage differential exceeded a characteristic threshold) of the modulators, and the modulators (1,1) and (1,2) are actuated. Conversely, because a high segment voltage 62 is applied along segment line 3, the display element voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the display element voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state. Then, the voltage on common line 2 transitions back to the low hold voltage 76.

Finally, during the fifth line time 60e, the voltage on common line 1 remains at high hold voltage 72, and the voltage on common line 2 remains at the low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 display element array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the display element voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the line time. Specifically, in implementations in which the release time of a modulator is greater than the actuation time, the release voltage may be applied for longer than a single line time, as depicted in FIG. 5A. In some other implementations, voltages applied along common lines or segment lines may vary to account for variations in the actuation and release voltages of different modulators, such as modulators of different colors.

Figure 6A:
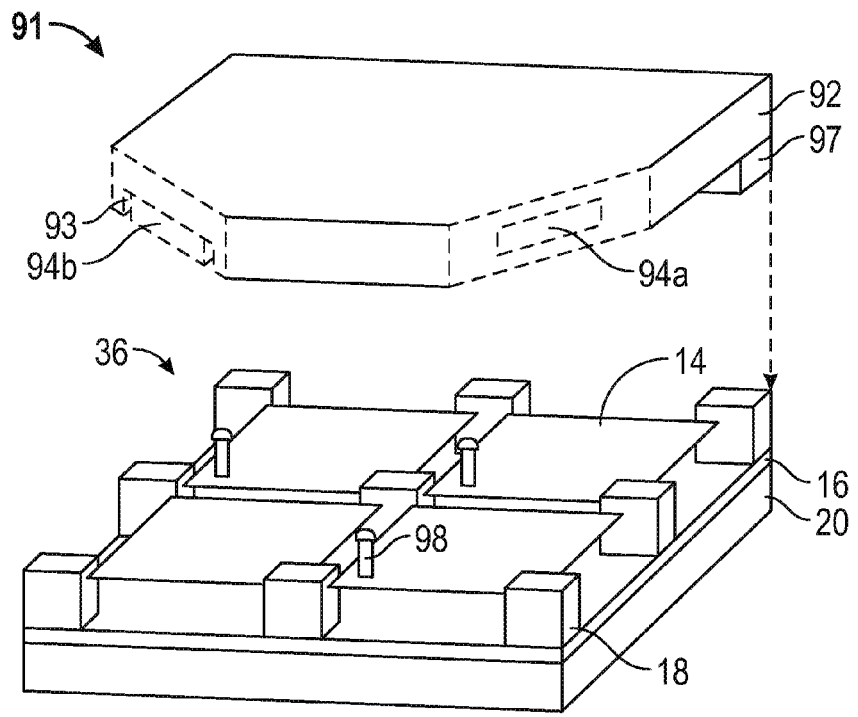
FIGS. 6A and 6B are schematic exploded partial perspective views of a portion of an electromechanical systems (EMS) package including an array of EMS elements and a backplate.
Figure 6B:
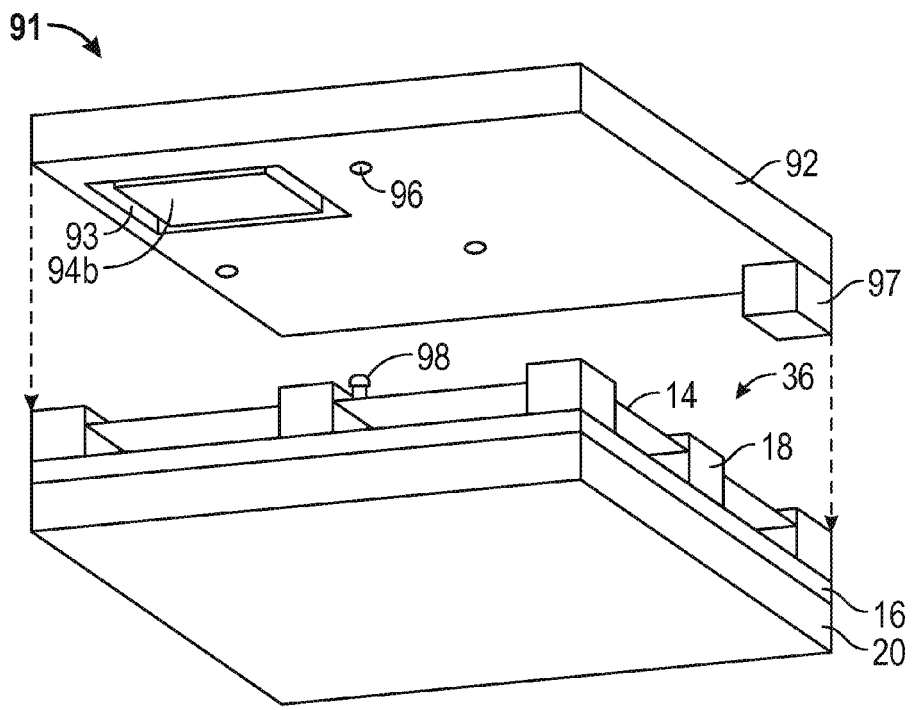

FIGS. 6A and 6B are schematic exploded partial perspective views of a portion of an EMS package 91 including an array 36 of EMS elements and a backplate 92. FIG. 6A is shown with two corners of the backplate 92 cut away to better illustrate certain portions of the backplate 92, while FIG. 6B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 6A and 6B, the backplate 92 can include one or more backplate components 94a and 94b, which can be partially or wholly embedded in the backplate 92. As can be seen in FIG. 6A, backplate component 94a is embedded in the backplate 92. As can be seen in FIGS. 6A and 6B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 6B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 6A and 6B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 6A and 6B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

Figure 7:
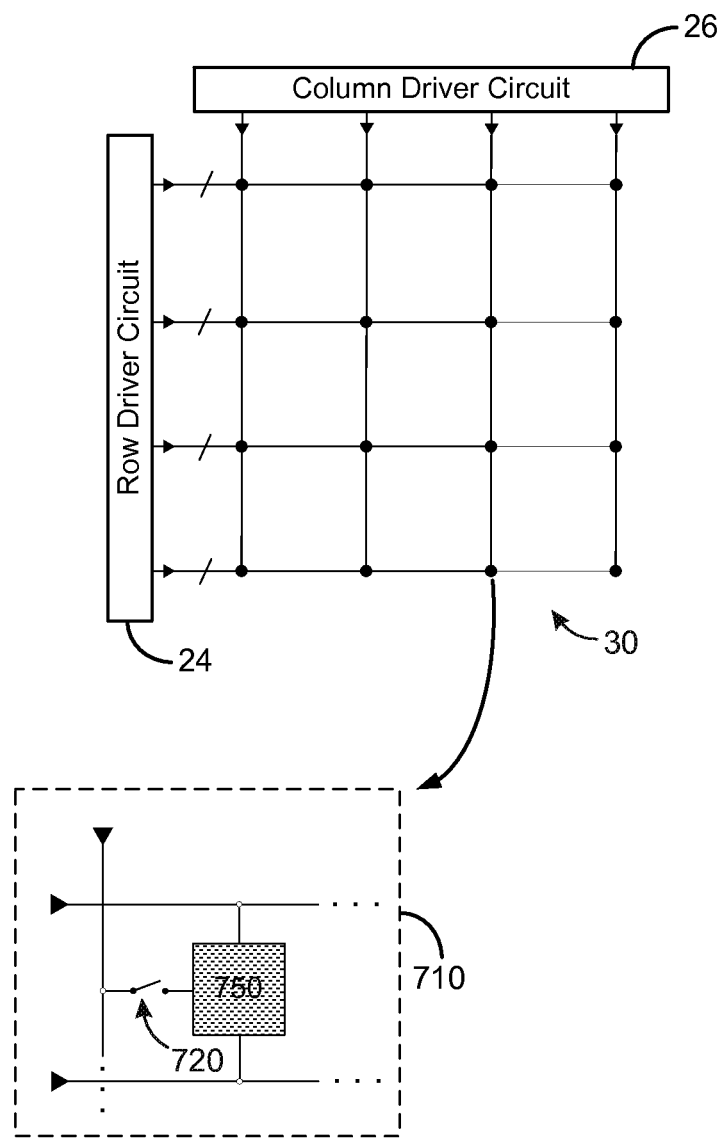
FIG. 7 is an example of a system block diagram illustrating an electronic device incorporating an IMOD-based display.

FIG. 7 is an example of a system block diagram illustrating an electronic device incorporating an IMOD-based display. Moreover, FIG. 7 depicts an implementation of row driver circuit 24 and column driver circuit 26 of array driver 22 that provide signals to, for example, display array or panel 30, as previously discussed.

As an example, display module 710 in the fourth row may include switch 720 and display unit 750. Display module 710 may be provided a row signal and a common signal from row driver circuit 24. Display module 710 may also be provided a column signal from column driver circuit 26. The implementation of display module 710 may include a variety of different designs. In some implementations, display unit 750 may be coupled with switch 720, such as a transistor with its gate coupled to the row signal and the column signal provided to the drain. Each display unit 750 may include an IMOD display element as a pixel.

Figure 8:
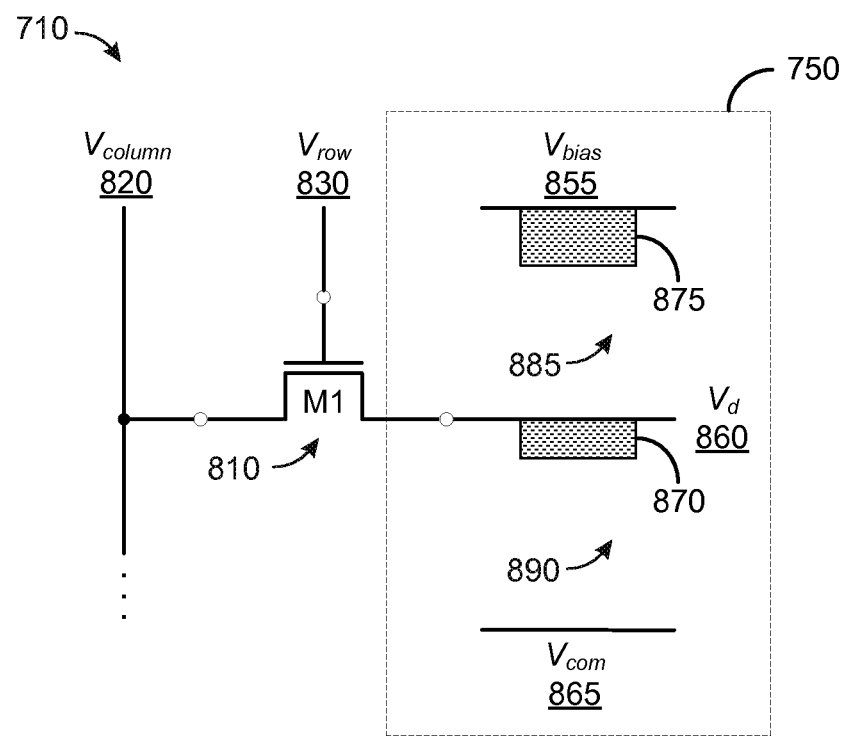
FIG. 8 is a circuit schematic of an example of a three terminal IMOD.

FIG. 8 is a circuit schematic of an example of a three terminal IMOD. In some implementations, the circuit of FIG. 8 may include display unit 750 (e.g., an IMOD) of FIG. 4. The circuit of FIG. 8 includes switch 720 of FIG. 7 implemented as an n-type metal oxide semiconductor (NMOS) transistor M1 810. The gate of transistor M1 810 is coupled to $V_{row}$ 830, which may be provided by row driver circuit 24 of FIG. 7. Transistor M1 810 is also coupled to $V_{column}$ 820, which may be provided by column driver circuit 26 of FIG. 7. In particular, if $V_{row}$ 830 is biased to turn transistor M1 810 on, the voltage on $V_{column}$ 820 may be applied to $V_d$ electrode 860.

In an implementation, display unit 750 may be a three terminal IMOD including three terminals or electrodes: $V_{bias}$ electrode 855, $V_d$ electrode 860, and $V_{com}$ electrode 865. Display unit 750 may also include movable element 870 and dielectric 875. Movable element 870 may include a mirror. Movable element 870 may be coupled with $V_d$ electrode 860. Additionally, in some implementations, air gap 885 may be between $V_{bias}$ electrode 855 and $V_d$ electrode 860. Air gap 890 may be between $V_d$ electrode 860 and $V_{com}$ electrode 865. In some implementations, display unit 750 may also include one or more capacitors. For example, one or more capacitors may be coupled between $V_d$ electrode 860 and $V_{com}$ electrode 865 or between $V_{bias}$ electrode 855 and $V_d$ electrode 860.

Movable element 870 may be positioned at various points between $V_{bias}$ electrode 855 and $V_{com}$ electrode 865 in order to reflect light at a specific wavelength. In particular, applied voltage biases of $V_{bias}$ electrode 855, $V_d$ electrode 860, and $V_{com}$ electrode 865 may determine the position of movable element 870. The position of movable element 870 may also determine the size of air gaps 885 and 890.

Process variations, temperature gradients, and other effects can cause the performance of individual display units, such as IMODs, to differ. That is, the same application of voltages may allow movable element 870 of two different IMODs to move to two slightly different positions from a consistent starting point. For example, FIGS. 9A, 9B, and 9C are examples of movable element 870 in different positions. In FIG. 9A, movable element 870 is positioned in a reset position, for example, against dielectric 875 and towards $V_{bias}$ electrode 855. Accordingly, air gap 885 is not available and air gap 890 is large. In FIG. 9B, movable element 870 is positioned at a different point between $V_{bias}$ electrode 855 and $V_{com}$ electrode 865. For example, the movable element of FIG. 9B may be moved from the reset position shown in FIG. 9A. In FIG. 9B, air gap 885 appears because movable element 870 is positioned away from dielectric 875 and $V_{bias}$ electrode 855 (i.e., the reset position), for example, by an application of voltages to one or more of $V_{bias}$ electrode 855, $V_d$ electrode 860, and $V_{com}$ electrode 865. Moreover, the size of air gap 890 is smaller than the size of air gap 890 in FIG. 9A.

However, another IMOD, under the same application of voltages and moving movable element 870 from the same position (e.g., the reset position), may position movable element 870 to a slightly different position. In FIG. 9C, movable element 870 may be positioned from the reset position of FIG. 9A. However, in FIG. 9C, movable element 870 is at a different position than movable element 870 in FIG. 9B. Movable element 870 in FIG. 9C is positioned Δd 960 away from the position of movable element 870 in FIG. 9B. Additionally, the size of air gaps 885 and 890 differ from air gaps 885 and 890 in FIG. 9B.

As such, both of the IMODs represented in FIGS. 9B and 9C reflect light at different wavelengths. For example, the IMOD of FIG. 9B may be at an expected position, but the IMOD of FIG. 9C is at an unexpected position, and therefore, reflecting light at an unexpected wavelength.

Figure 9D:
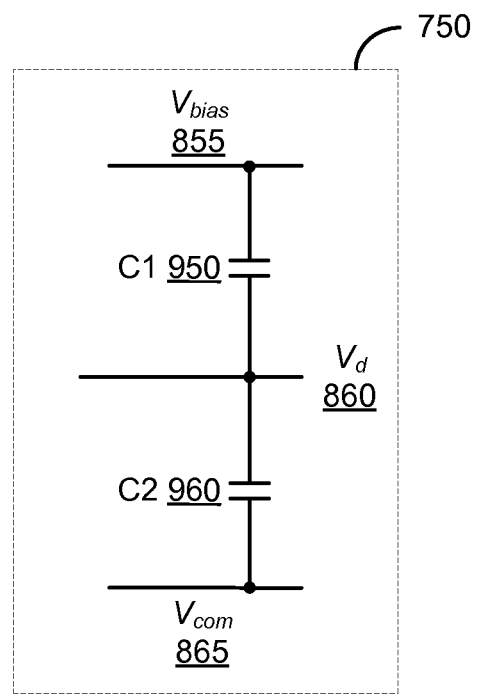
FIG. 9D is an example of an illustration of capacitances in an IMOD.

FIG. 9D is an example of an illustration of capacitances in an IMOD. In FIG. 9D, capacitance C1 950 may be the equivalent capacitance between $V_{bias}$ electrode 855 and $V_d$ electrode 860. For example, capacitance C1 950 may be the equivalent series capacitance of air gap 885 and dielectric 875. Capacitance C2 960 may be the equivalent capacitance between $V_d$ electrode 860 and $V_{com}$ electrode 865. For example, capacitance C2 960 may be the equivalent series capacitance of air gap 890 and movable element 870. Air gaps 885 and 890 may affect capacitance values of capacitance C1 950 and C2 960. Accordingly, as movable element 870 is positioned, the sizes of air gaps 885 and 890 may change, and therefore, change the values of capacitances C1 950 and C2 960.

Figure 10A:
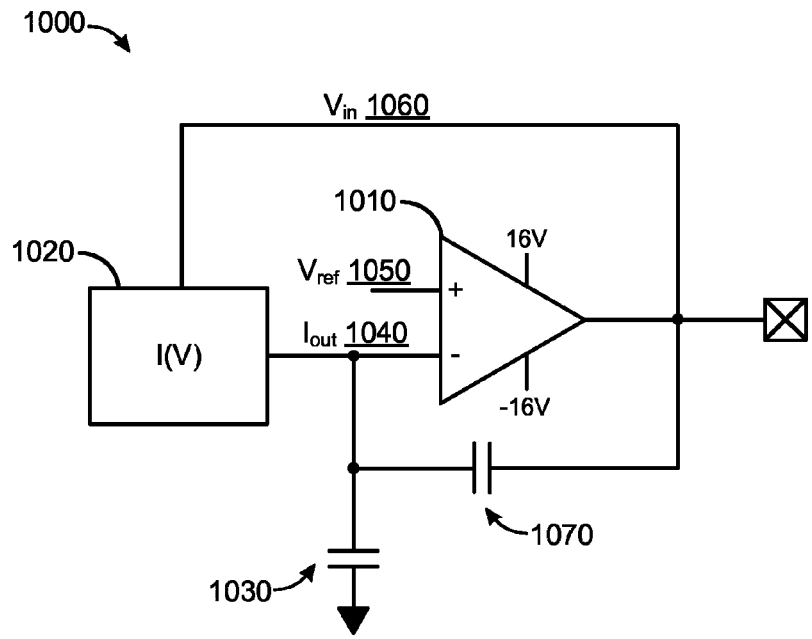
FIG. 10A is a circuit schematic illustrating an example of a closed loop measurement circuit.

FIG. 10A is a circuit schematic illustrating an example of a closed loop measurement circuit. Measurement circuit 1000 of FIG. 10A may be used to provide measurements regarding capacitances of a display unit, such as an IMOD (e.g., capacitances C1 950 and C2 960), and therefore, provide an indication as to the position of movable element 870.

In measurement circuit 1000 of FIG. 10A, an operational amplifier (op-amp) 1010 provides an output $V_{in}$ 1060 that is an input to voltage controlled current source 1020. Voltage controlled current source 1020 provides an output $I_{out}$ 1040 as an input to op-amp 1010. Op-amp 1010 may also include another input $V_{ref}$ 1050. $I_{out}$ 1040 may also be provided to one or more display units, such as IMODs, modeled as capacitor 1030, and feedback capacitor 1070. Feedback capacitor 1070 may also be coupled with $V_{in}$ 1060. In some implementations, feedback capacitor 1070 may include multiple capacitors providing an equivalent capacitance.

Figure 10B:
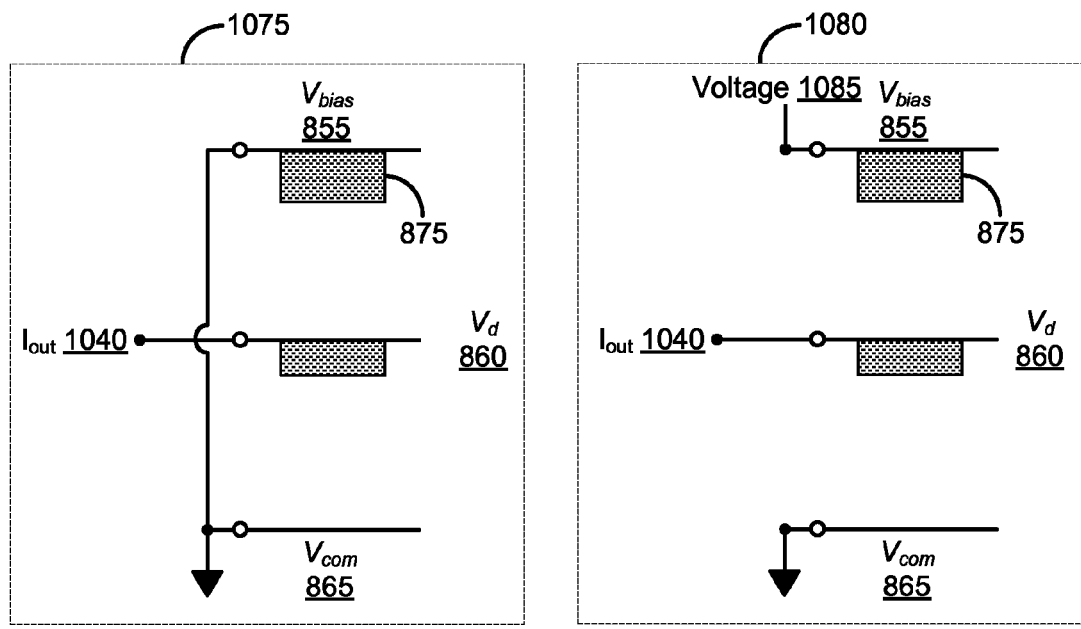
FIG. 10B is a circuit schematic illustrating an example of a three terminal IMOD coupled with the closed loop measurement circuit of FIG. 10A.

FIG. 10B is a circuit schematic illustrating an example of a three-terminal IMOD coupled with the closed loop measurement circuit of FIG. 10A. As previously discussed, as the size of air gaps 885 and 890 change (i.e., from positioning movable element 870), capacitance values of an IMOD may also change. In FIG. 10A, one or more IMODs may be modeled as capacitor 1030, with the capacitance changing based on the sizes of air gaps 885 and/or 890. In some implementations, a terminal of each of the three-terminal IMODs may be coupled to a fixed voltage, such as 0 V. A second terminal may be coupled with $I_{out}$ 1040. The terminals may be associated with $V_{bias}$ electrode 855, $V_d$ electrode 860, and/or $V_{com}$ electrode 865. Accordingly, capacitances C1 950 (i.e., the capacitance between $V_{bias}$ electrode 855 and $V_d$ electrode 860) and C2 960 (i.e., the capacitance between $V_d$ electrode 860 and $V_{com}$ electrode 865) may be measured. For example, If $V_d$ electrode 860 is coupled with $I_{out}$ 1040 and $V_{com}$ electrode 865 is the other terminal (e.g., grounded in FIG. 10A), then capacitor 1030 may model capacitance C2 960. Likewise, if $V_d$ electrode 860 is coupled with $I_{out}$ 1040 and $V_{bias}$ electrode 855 is the other terminal (e.g., grounded in FIG. 10A), then capacitor 1030 may model capacitance C1 950. Capacitance C1 950 and C2 960 may also be measured in parallel. As an example, in configuration 1075 of FIG. 10B, both $V_{bias}$ electrode 855 and $V_{com}$ electrode 865 may be, for example, grounded and $V_d$ electrode 860 may be coupled with $I_{out}$ 1040. That is, $V_{bias}$ electrode 855 and $V_{com}$ electrode 865 may be coupled with the same voltage source and applied the same voltage bias. As another example, in configuration 1080 of FIG. 10B, $V_d$ electrode 860 may be coupled with $I_{out}$ 1040 and both $V_{bias}$ electrode 855 and $V_{com}$ electrode 865 may be biased to different voltages. In configuration 1080, $V_{com}$ 865 is coupled with ground and $V_{bias}$ 855 is coupled with another voltage source 1085. In FIG. 10B, the terminals of the three-terminal IMOD may be coupled with voltage sources such that a terminal is not floating when measurements are being provided by measurement circuit 1000. However, in another implementation, a configuration may include a floating terminal (e.g., $V_{bias}$ electrode 855 or $V_{com}$ electrode 865). In some scenarios, configuration 1080 may provide measurements that provide a better indication of the position of movable element 870. Configuration 1075 or the configuration with a floating electrode may provide better sensitivity (e.g., capacitance changes may be a higher percentage of measured capacitance).

$V_{ref}$ 1050 in FIG. 10A may provide a voltage ramping, for example, from 0 to 14 V as an input to op-amp 1010. The voltage range of 0 to 14 V may be associated with moving movable element 870 throughout its entire travel range. For example, if movable element 870 is in a reset position (e.g., FIG. 9A), the voltage range of 0 to 14 V may provide positions for movable element 870 to move from the reset position to the end of its travel range, for example, against or towards $V_{com}$ electrode 865.

Voltage controlled current source 1020 may be configured to provide a particular gain, for example, 1 nanoampere (nA) per 1 millivolt (mV) (i.e., a linear gain). That is, for every 1 mV provided by op-amp 1010's output $V_{in}$ 1060, voltage controlled current source 1020 may provide 1 nA. In general, a voltage controlled current source with a sensitive gain may provide a low signal-to-noise ratio such that a small number of display units with a low capacitance change may be measured. In other implementations, voltage controlled current source 1020 may provide a non-linear gain. In some scenarios, providing a linear gain may allow easier capacitance calculations from current measurements provided by measurement circuit 1000.

Accordingly, the output of op-amp 1010 (i.e., $V_{in}$ 1060) provides a differential input voltage between inputs $V_{ref}$ 1050 and the voltage on the display units (e.g., $V_d$ electrode 860 of an IMOD if it is coupled with $I_{out}$ 1040) modeled as capacitor 1030. Since $V_{in}$ 1060 is provided as a feedback to voltage controlled current source 1020, the output of voltage controlled current source 1020 (i.e., $I_{out}$ 1040) will provide an increase in current until the voltage on the terminal of the IMODs coupled with $I_{out}$ 1040 matches the voltage on $V_{ref}$ 1050. That is, $V_{in}$ 1060 may keep rising until $T_{out}$ 1040 is high enough to charge capacitor 1030 to a voltage matching $V_{ref}$ 1050. As such, the IMOD's movable element 870 may move throughout its travel range as $V_{ref}$ 1050 ramps up in voltage. Since movable element 870 is moving as $V_{ref}$ 1050 ramps in voltage, the size of air gaps 885 and 890 may change, and therefore, capacitances C1 950 and C2 960 may also change.

Measurement data regarding $V_{in}$ 1060 (i.e., the output of op-amp 1010) is therefore proportional to the current used to charge the electrode that is coupled with $I_{out}$ 1040, for example, $V_d$ electrode 860 associated with movable element 870. Since the voltage on $V_{in}$ 1060 is proportional to the current being provided to $V_d$ electrode 860 to move movable element 870 throughout the entire travel range, the capacitances may be calculated from data collected from $V_{in}$ 1060. Accordingly, the voltage on $V_{in}$ 1060, provided by op-amp 1010, may be used to generate capacitance data of the IMODs. The capacitance data may be used to determine positions of movable element 870. As discussed later herein, an analog-to-digital converter may be used to collect data on $V_{in}$ 1060. The data may be stored in memory and analyzed by a microcontroller.

In some implementations, feedback capacitor 1070 may be coupled with $I_{out}$ 1040 and $V_{in}$ 1060. Feedback capacitor 1070 may aid in maintaining stable operation of the op-amp by reducing oscillations on $V_{in}$ 1060 (i.e., the output of op-amp 1010). In some implementations, the capacitance of feedback capacitor 1070 may be equal to or smaller than the capacitance of capacitor 1030. For example, the capacitance of capacitor 1070 may be between 2.7 picofarads (pF) to 10 pF. In some implementations, if 25 IMODs are modeled as capacitor 1030, capacitor 1070 may have a capacitance of 2.7 pF.

Figure 11A:
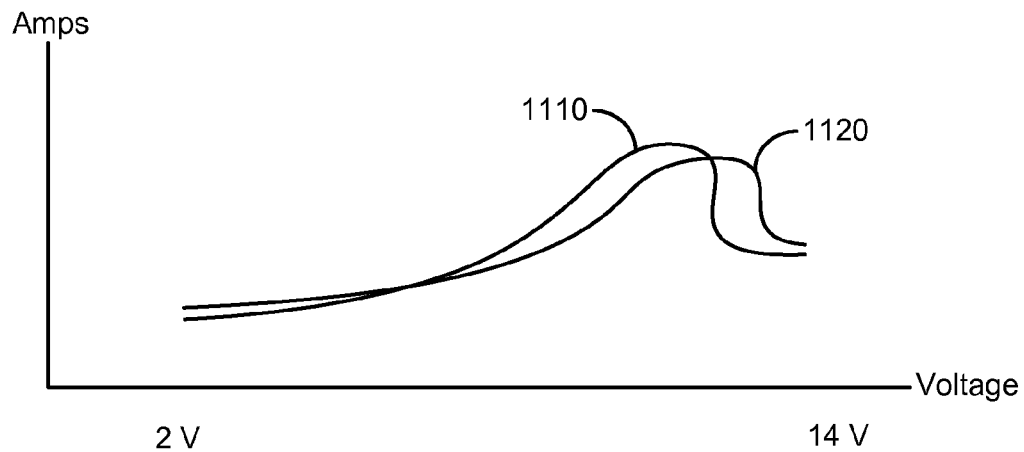
FIG. 11A is an illustration of an example of current vs. voltage associated with IMODs.

FIG. 11A is an illustration of an example of current vs. voltage associated with display units, such as IMODs. In FIG. 11A, measurement 1110 may be associated with a first IMOD or group of IMODs. Measurement 1120 may be associated with a second IMOD or group of IMODs. The x-axis may represent $V_{ref}$ 1050 ramping in voltage, for example, from 2 to 14 V. The y-axis may represent the current associated with $I_{out}$ 1040 (i.e., the current generated by voltage controlled current source 1020 based on the voltage provided by $V_{in}$ 1060).

As previously discussed, deviations from process variations, temperature gradients, and other effects may cause IMODs or groups of IMODs to have different characteristics, and therefore, different performances. Accordingly, measurement 1110 and measurement 1120 are associated with different curves.

Figure 11B:
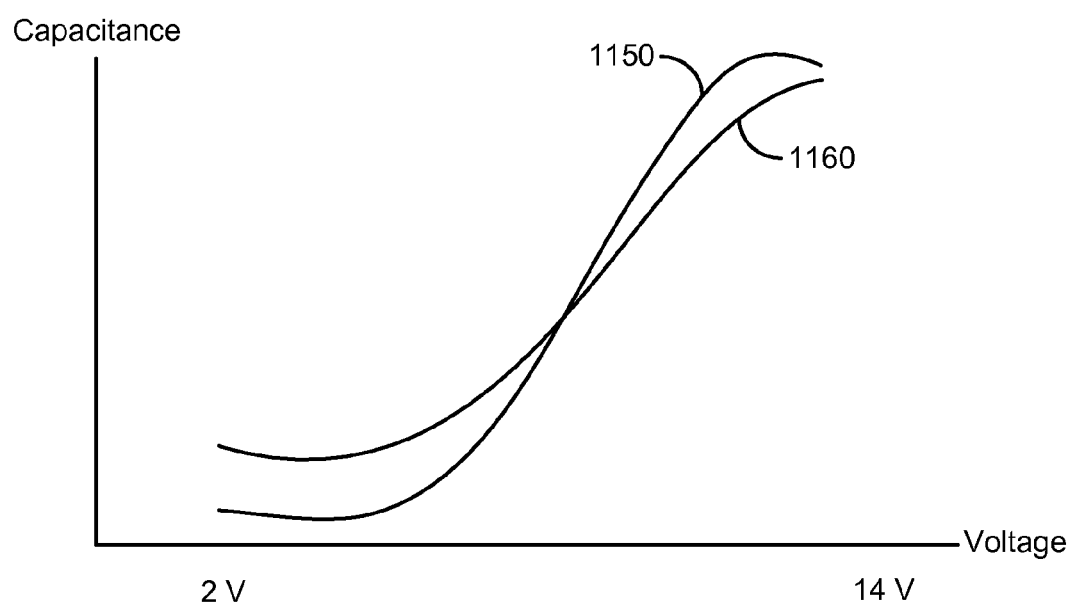
FIG. 11B is an illustration of an example of capacitance vs. voltage associated with IMODs.

Based on the $V_{in}$ 1060 measurement data, capacitance values may be obtained. FIG. 11B is an illustration of an example of capacitance vs. voltage associated with IMODs. In FIG. 11B, curve 1150 may be associated with the first IMOD or group of IMODs associated with measurement 1110. Curve 1160 may be associated with the second IMOD or group of IMODs associated with measurement 1120. The x-axis may represent $V_{ref}$ 1050 ramping in voltage. The y-axis may represent the capacitance associated with IMODs as $V_{ref}$ 1050 ramps in voltage. Because the capacitances are associated with different sizes of air gaps 885 and/or 890, the capacitance values on the y-axis represent different positions for movable element 870. Accordingly, if the IMODs or groups of IMODs associated with curves 1150 and 1160 performed the same, the same application of voltages would result in the same capacitance values because movable element 870 would move to the same expected position. As such, curves 1150 and 1160 would be the same. However, in FIG. 11B, the same application of voltages result in different capacitance values for curves 1150 and 1160 due to different performance characteristics, as previously discussed. Accordingly, curves 1150 and 1160 are different.

For example, applying 8 V to a first IMOD or group of IMODs may provide a capacitance value of 1.85e-10 farads (F). A capacitance of 1.85e-10 F may be associated with a certain size air gap (i.e., movable element 870 has been positioned to a particular location from a starting location such that an air gap of a particular size is also created between movable element 870 and an electrode of the IMOD). However, a second IMOD or group of IMODs may provide a capacitance value of 1.80e-10 F for an application of 8 V on $V_{ref}$ 1050 with movable element 870 moving from the same starting position. That is, for the second IMOD or group of IMODs, movable element 870 may move to a different position than the first IMOD or group of IMODs. Accordingly, when the respective movable elements 870 need to be moved to the same position, an offset (for example, determined based on the measurements provided by circuit 1000 in FIG. 10A) may be provided such that slightly different voltages may be applied in order to move movable elements 870 to the same position, and therefore, reflect light at the same wavelength.

Figure 12:
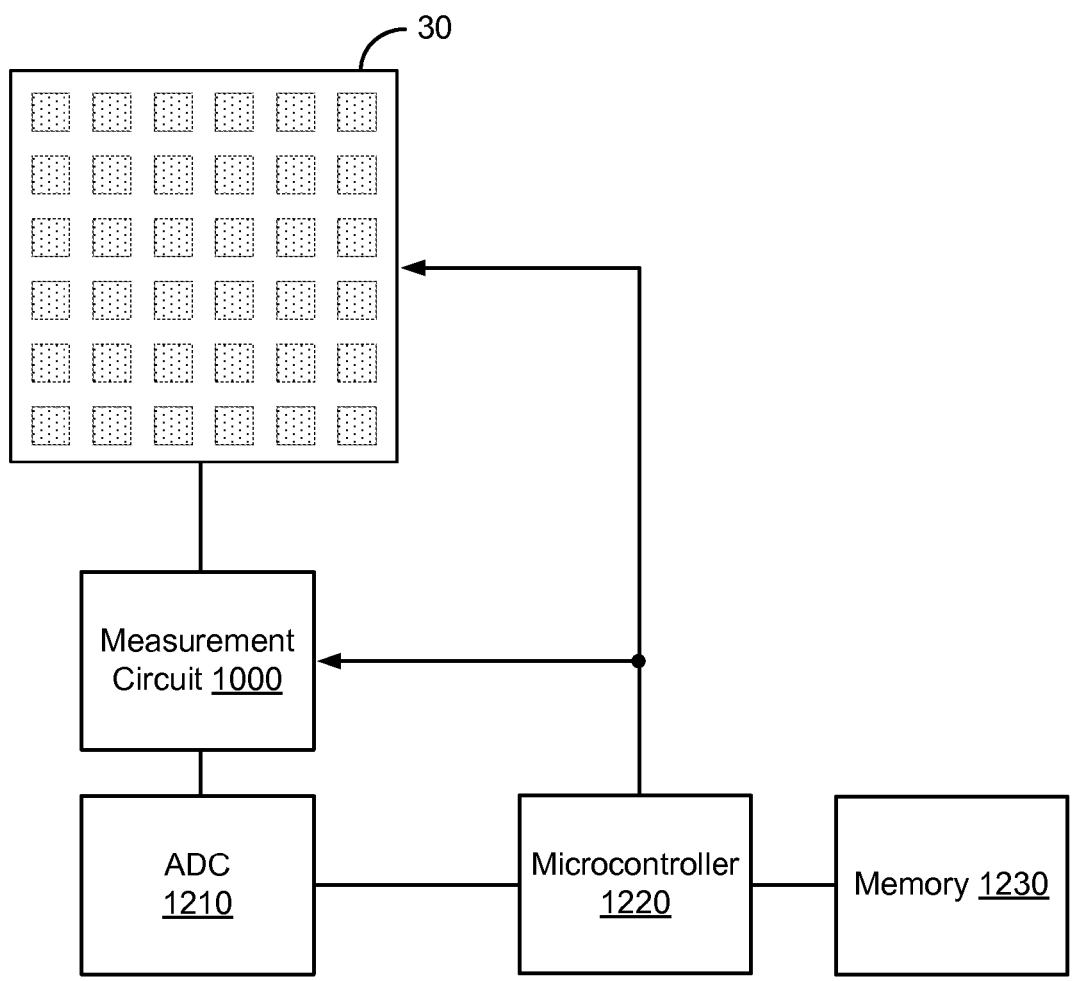
FIG. 12 is an example of a system block diagram of a system incorporating the measurement circuit of FIG. 10A.

FIG. 12 is an example of a system block diagram of a system incorporating the measurement circuit of FIG. 10A. As previously discussed, measurement circuit 1000 may provide measurement data regarding one or more IMODs in display 30. In some implementations, the measurement data generated by measurement circuit 1000 may be provided to analog-to-digital converter (ADC) 1210. That is, $V_{in}$ 1060 (i.e., the output of op-amp 1010) may be an input to ADC 1210.

In an implementation, ADC 1210 may digitize the data and provide it to microcontroller 1220, which may store the measurement data in memory 1230. In other implementations, ADC 1210 may store the measurement data in memory 1230.

Microcontroller 1220 may analyze the measurement data in memory 1230 and determine offsets to be provided to driver circuitry (e.g., row driver circuit 24 and column driver circuit 26) used to bias $V_{bias}$ electrode 855, $V_d$ electrode 860, and $V_{com}$ electrode 865. As previously discussed, the offsets may be used to determine proper voltage biases to position movable element 870 to an expected position.

Microcontroller 1220 may also analyze the measurement data in memory 1230, or as the data is received from ADC 1210, and change various parameters associated with measurement circuit 1000 or display 30. For example, microcontroller 1220 may, based on the measurement data, change (e.g., raise or lower) the gain of voltage controlled current source 1020 based on a number of display units (e.g., IMODs) being measured, as discussed below. Additionally, microcontroller 1220 may change the ramp of $V_{ref}$ 1050 by changing the voltage range or the ramp rate. Changing the ramp rate may also be used to control the gain of voltage controlled current source 1020 because a higher ramp rate allows for a higher response. For example, the time $V_{ref}$ 1050 progresses through the voltage range may change from 2.5 ms to 3.0 ms, or vice versa. Additionally, voltage ranges may be changed. For example, measurement data may be obtained at different $V_{ref}$ 1050 voltages ranges, such as ramping up from 1 V to 15 V, ramping down from 15 V to 1 V, ramping down in negative voltages from −1 V to −15 V, and ramping up in negative voltages from −15 V to −1 V. Accordingly, a wide variety of measurements at different ramp rates and/or voltage ranges may be generated by measurement circuit 1000.

Figure 13:
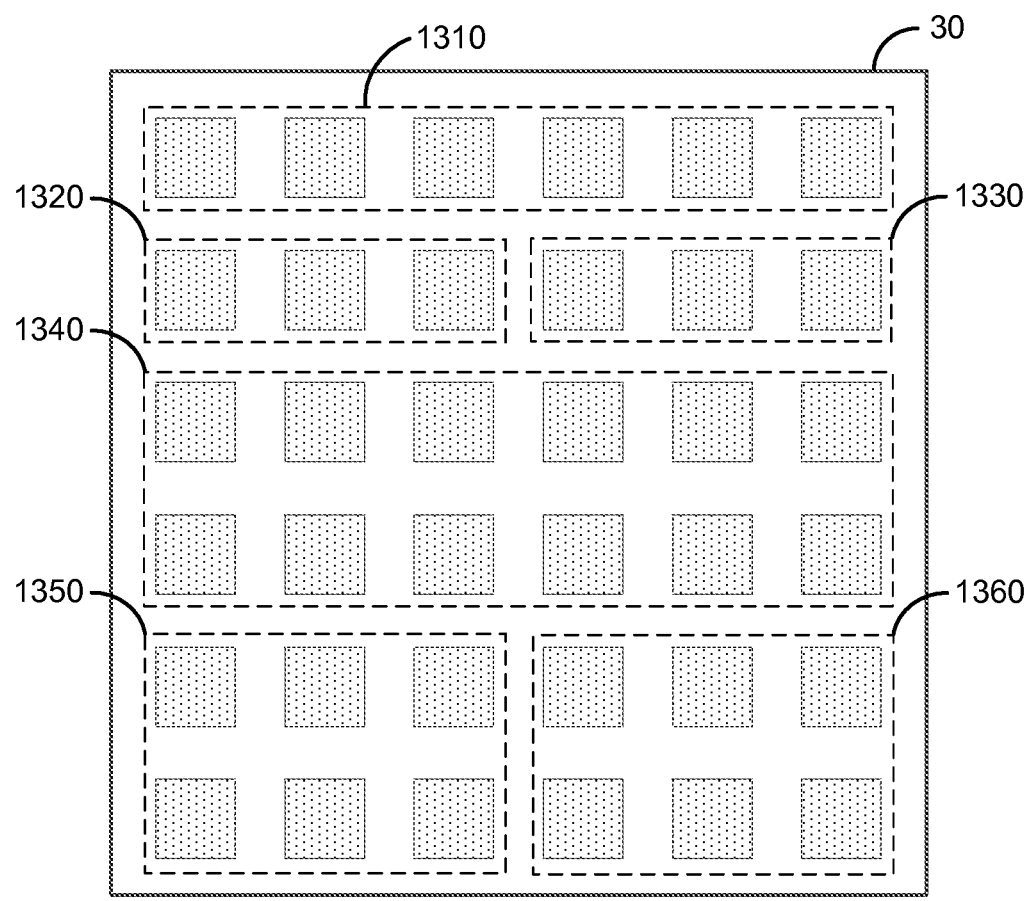
FIG. 13 illustrates an example of a six-by-six display array.

Microcontroller 1220 may also change the number of IMODs measured at a time. That is, the number of IMODs that are coupled with $I_{out}$ 1040 may also be changed by microcontroller 1220. FIG. 13 illustrates an example of a six-by-six display array 30.

As an example, measurement circuit 1000 may first measure six IMODs in a row at a time. Accordingly, IMOD group 1310 may include six IMODs with a terminal coupled with $I_{out}$ 1040, as in group 1310. In the next row, microcontroller 1220 may configure display array 30 such that only three IMODs are coupled with $I_{out}$ 1040. Accordingly, groups 1320 and 1330 may independently be coupled with $I_{out}$ 1040 and provide separate $V_{in}$ 1060 measurements. Next, group 1340 may be selected, which includes twelve IMODs in two separate rows. Groups 1350 and 1360 may also be configured by microcontroller 1220.

In some implementations, if the number of IMODs in a group is increased, the ramp rate of $V_{ref}$ 1050 may be lowered so that the output response of op-amp 1010 may stay approximately similar without changing the gain of voltage controlled current source 1020. For example, the ramp rate of $V_{ref}$ 1050 may be lowered when microcontroller 1220 configures the selection of IMODs from group 1330 (i.e., three IMODs) to group 1340 (i.e., twelve IMODs).

In an implementation, if the number of display units in a group is changed, the capacitance of capacitor 1070 (e.g., a single capacitor, or a group of capacitors) may also be dynamically changed by microcontroller 1220. For example, if the number of display units in the group is increased, the capacitance of capacitor 1070 may be increased. If the number of display units in the group is decreased, the capacitance of capacitor 1070 may be decreased such that the total capacitance of capacitor 1070 is less than or equal to the capacitance associated with the display units in the group.

The capacitance of capacitor 1070 may be changed through a variety of mechanisms. For example, a network of capacitors may be coupled in series and/or parallel with each other through switches. Microcontroller 1220 may control the switches and turn particular switches on or off such that an equivalent capacitance is provided by multiple capacitors. Other examples include a varactor (e.g., a varicap diode), a MEMS or NEMS-based variable or tuned capacitor, or any other variable capacitor or mechanism to provide variable capacitance.

In another implementation, the number of IMODs in a group may change as measurement data is analyzed by microcontroller 1220. For example, if a large area or number of IMODs are indicated as deviating from an expected capacitance value, a smaller number of IMODs may be grouped together to provide $V_{in}$ 1060 measurements.

In some implementations, microcontroller 1220 may also change the terminal associated with the IMOD or group of IMODs that is coupled with $I_{out}$ 1040 and used to provide $V_{in}$ 1060. For example, microcontroller 1220 may configure an IMOD such that capacitance C1 950 between $V_{bias}$ electrode 855 and $V_d$ electrode 860 is measured. Microcontroller 1220 may also configure an IMOD such that capacitance C2 960 between $V_d$ electrode 860 and $V_{com}$ electrode 865 is measured.

Figure 14:
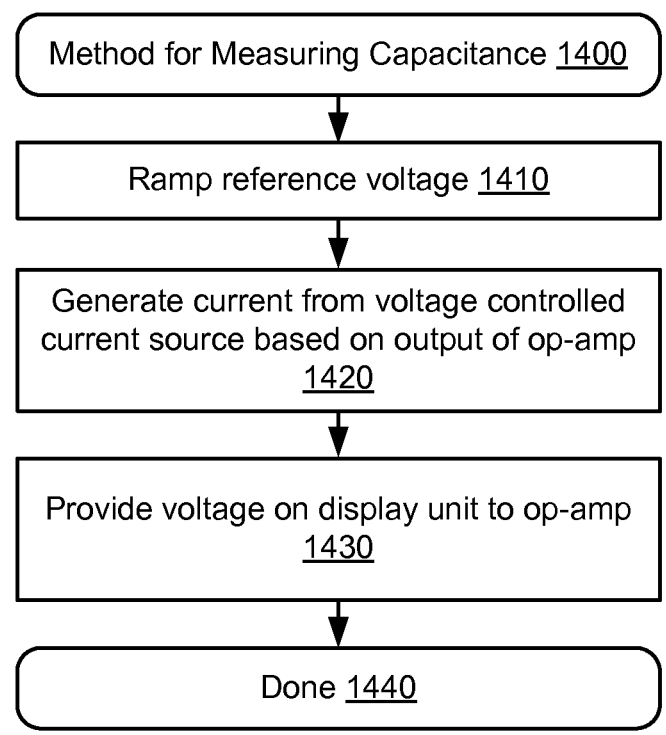
FIG. 14 is a flow diagram illustrating a method for measuring capacitance.

FIG. 14 is a flow diagram illustrating a method for measuring capacitance. In method 1400, at block 1410, a reference voltage provided as an input to an op-amp may be ramped at voltages associated with positioning movable element 870 throughout its travel range. At block 1420, the output of the op-amp may be provided as feedback to a voltage controlled current source to generate current according to a gain, as previously discussed. Accordingly, the current may be provided to a display unit or group of display units (e.g., an IMOD or group of IMODs), and therefore, a voltage may also be generated. At block 1430, the voltage may be provided to the op-amp. Accordingly, the op-amp may provide an output as the differential input voltage of the reference voltage and the voltage associated with the display unit or group of display units. The method ends at block 1440.

Figure 15:
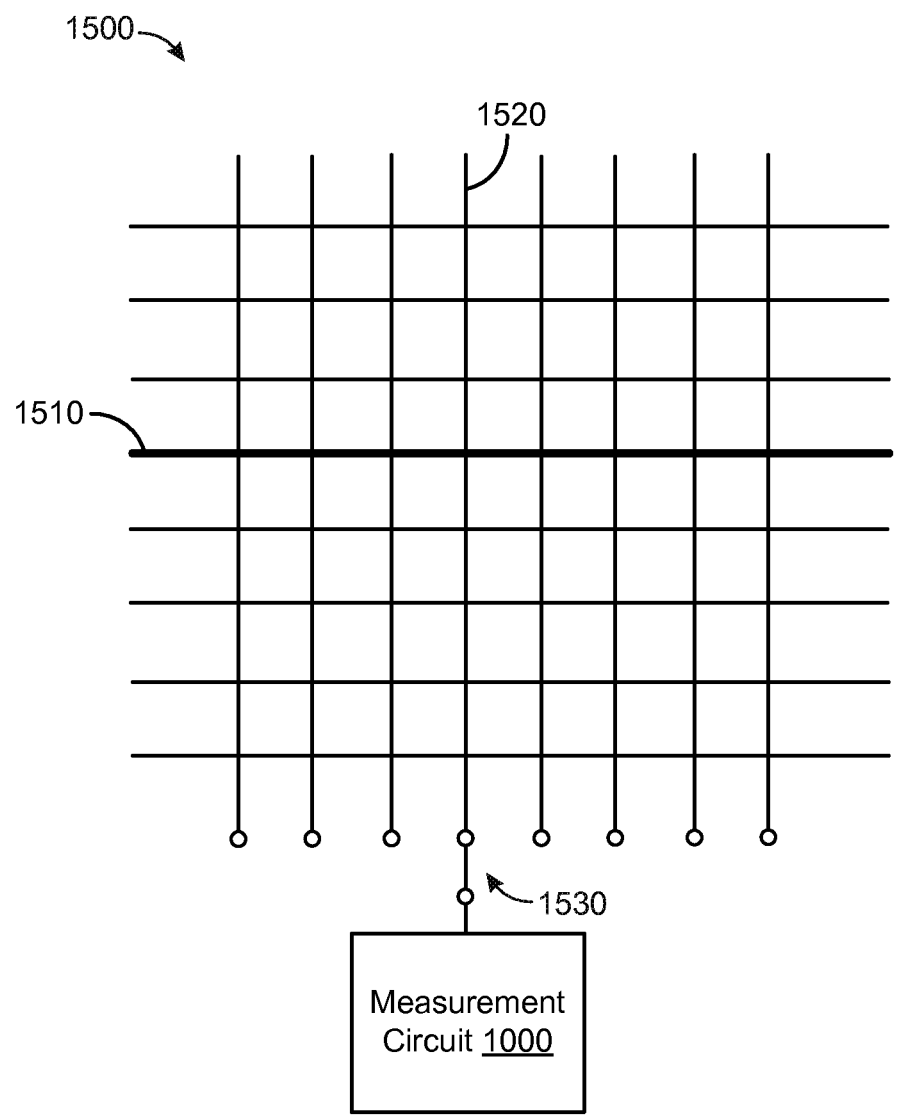
FIG. 15 is an example of a system block diagram using the measurement circuit of FIG. 10A to measure leakage.

FIG. 15 is an example of a system block diagram using the measurement circuit of FIG. 10A, or an implementation similar thereof, to measure leakage. In FIG. 15, interconnect layout 1500 may represent interconnect for electrodes of a display unit, such as an IMOD. For example, in one implementation, the vertical interconnect may be associated with $V_d$ electrode 860 and the horizontal interconnect may be associated with $V_{bias}$ electrode 855 and/or $V_{com}$ electrode 865. Accordingly, each intersection in interconnect layout 1500 may represent an IMOD.

In FIG. 15, interconnect 1510 may be biased, for example, at 0 V. Interconnect 1520 may be coupled with $I_{out}$ 1040 of measurement circuit 1000 in FIG. 14. The other interconnect in interconnect layout 1500 may be biased at the same voltage, for example, 1 V. Additionally, measurement circuit 1000 may be coupled with interconnect 1520 via switch 1530. Moreover, $V_{ref}$ 1050 of measurement circuit 1000 may be set to a fixed voltage, such as 1 V, rather than a ramping voltage source.

If $V_{ref}$ 1050 is set to 1 V, and there is no leakage between interconnect 1510 and 1520, then the output of measurement circuit 1000 should be 0 V because $I_{out}$ 1040 should follow 1 V from $V_{ref}$ 1050, and therefore, the output of measurement circuit 1000 would be 0V. However, if there is leakage between interconnect 1520 and interconnect 1510, then the voltage may deviate from 0 V because $I_{out}$ 1040 may not follow $V_{ref}$ 1050. That is, if there is leakage between interconnect 1510 biased at 0 V and interconnect 1520 coupled with $I_{out}$ 1040, then the voltage on $I_{out}$ 1040 may not be 1 V (i.e., the voltage of $V_{ref}$ 1050) because of leakage to interconnect 1510, and therefore, the output of measurement circuit 1000 may not be 0 V.

In some implementations, multiple groups of display units may be measured for leakage, similar to measuring $V_{in}$ 1060 associated with capacitance of groups of display units, as previously discussed. For example, leakage associated with 25 display units at a time may be measured. Accordingly, $V_{ref}$ 1050 may be set to 1 V to apply 1 V to $V_d$ electrode 860 and the other sides of the display units, such as electrode 855 and electrode 865 of an IMOD, may be set to 0 V.

In an implementation, measurement circuit 1000 may couple with one or more vertical interconnects in interconnect layout 1500 via switch 1530. Each horizontal interconnect in interconnect layout 1500 may then be biased one at a time at another voltage from the rest of interconnect layout 1500. When all of the horizontal interconnect have been biased at the other voltage, switch 1530 may be configured to couple measurement circuit 1000 with another vertical interconnect and the horizontal interconnects may again be biased at the other voltage one at a time. The process may repeat until leakage associated with each display unit is determined.

Figure 16:
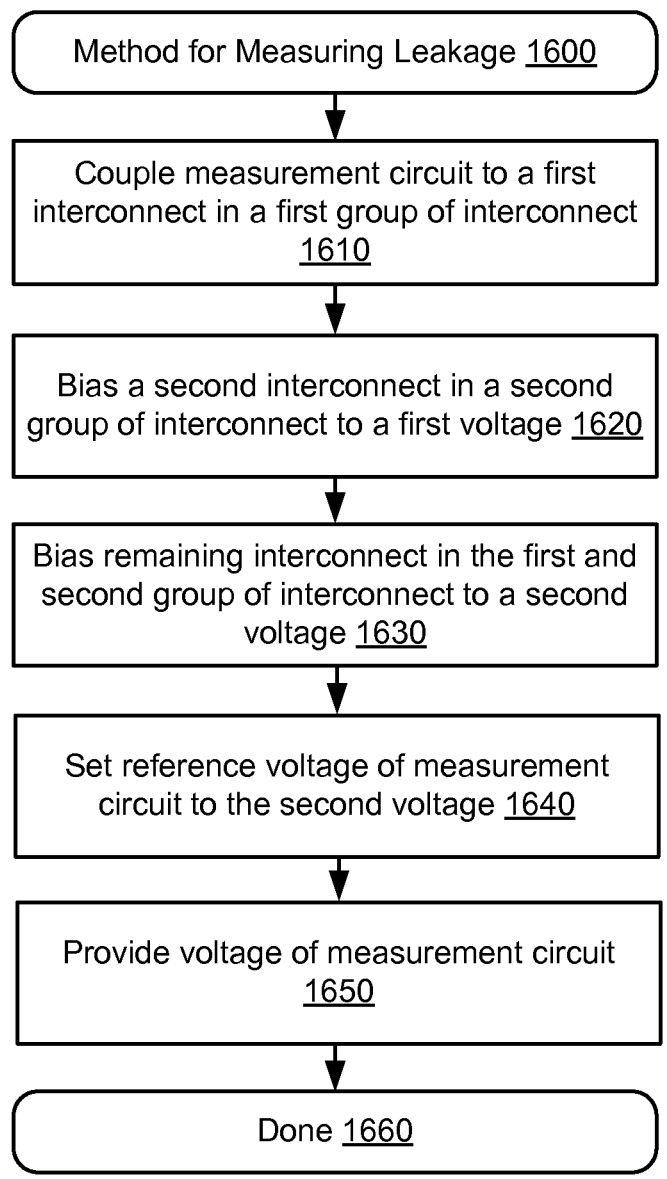
FIG. 16 is a flow diagram illustrating a method for measuring leakage.

FIG. 16 is a flow diagram illustrating a method for measuring leakage. In method 1600, at block 1610, a measurement circuit may be coupled to a first interconnect in a first group of interconnects. For example, in the example of FIG. 15, the measurement circuit may be coupled to a vertical interconnect associated with an electrode of a display unit. In block 1620, a second interconnect from a second group of interconnects may be biased to a first voltage. For example, interconnect associated with another electrode of display unit than the first interconnect may be biased to 0 V. At block 1630, the remaining interconnect in the first and second groups may be biased at a second voltage, such as 1 V, such that a leakage current may be generated. In block 1640, a reference voltage in the measurement circuit may be set to the second voltage. For example, $V_{ref}$ 1050 may also be set to 1 V. In block 1650, the voltage of the measurement circuit may be generated. If the voltage is 0 V, then there is no leakage between the electrodes associated with the first interconnect and the second interconnect. At block 1660, the method ends.

Figure 17A:
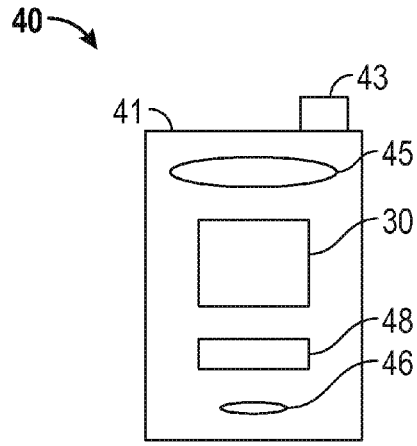
FIGS. 17A and 17B are system block diagrams illustrating a display device that includes a plurality of IMOD display elements.
Figure 17B:
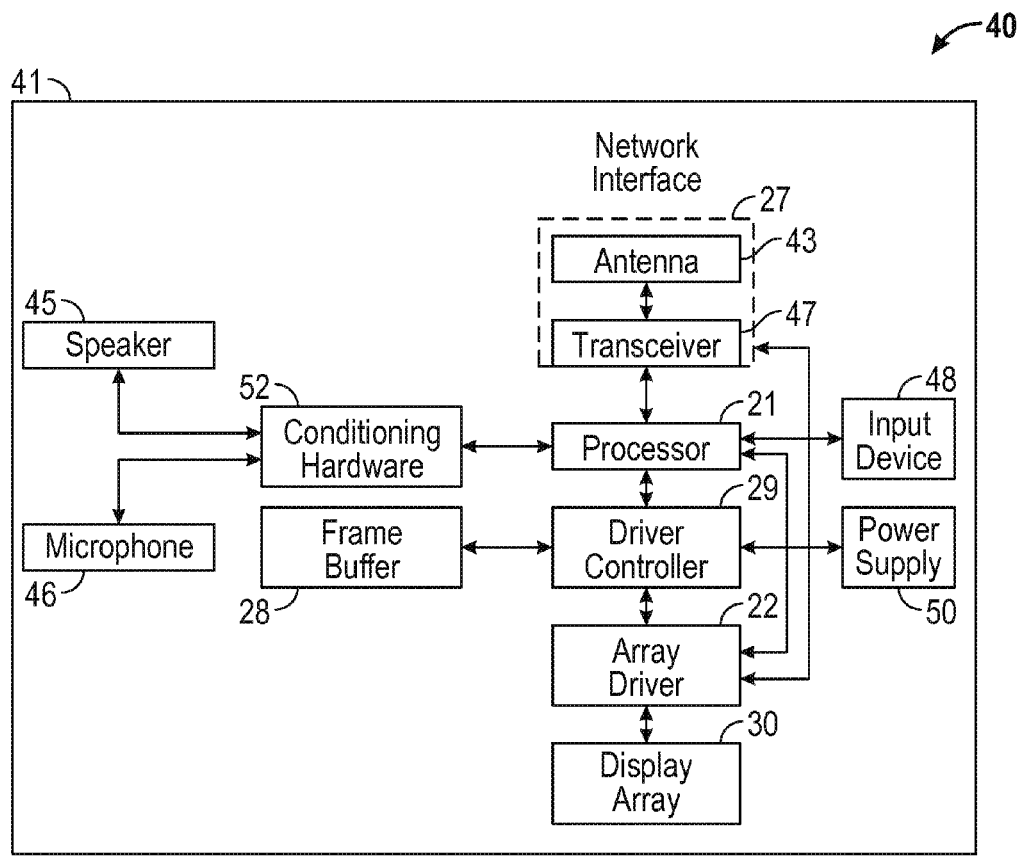

FIGS. 17A and 17B are system block diagrams illustrating a display device 40 that includes a plurality of IMOD display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 17A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 17A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HS-DPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

The circuits and techniques disclosed herein utilize examples of values (e.g., voltages, capacitances, dimensions, etc.) that are provided for illustration purposes only. Other implementations may involve different values.

What is claimed is:

1. A circuit comprising:
    an amplifier having a first input, a second input, and an output, the first input of the amplifier coupled with a voltage reference source;
    a current source having an input and an output, the input of the current source coupled with the output of the amplifier, the output of the current source coupled with the second input of the amplifier, the current source being voltage controlled; and
    one or more display units having a first terminal coupled with the second input of the amplifier and with the output of the current source, wherein the current source is configured to provide a current based on a voltage associated with the output of the amplifier, the current increasing until a voltage associated with the first terminal of the one or more display units equals a voltage associated with the voltage reference source, wherein the first terminal of the one or more display units is associated with a movable element, and the voltage reference source is configured to ramp through a voltage range associated with a travel range of the movable element.

2. The circuit of claim 1, further comprising:
    a feedback capacitor having a first terminal and a second terminal, the first terminal of the feedback capacitor coupled with the output of the current source, the second terminal of the feedback capacitor coupled with the output of the amplifier.

3. The circuit of claim 2, wherein a capacitance of the feedback capacitor is less than or equal to a capacitance of the one or more display units.

4. The circuit of claim 1 further comprising:
    an analog-to-digital converter having an input coupled with the output of the amplifier.

5. The circuit of claim 1, wherein the one or more display units have a second terminal set to a first fixed voltage.

6. The circuit of claim 5, wherein the one or more display units have a third terminal set to the first fixed voltage.

7. The circuit of claim 5, wherein the one or more display units have a third terminal set to a second fixed voltage.

8. The circuit of claim 1, wherein the travel range of the movable element is between a second terminal and a third terminal of the display unit.

9. The circuit of claim 1, wherein the current source has a linear gain.

10. The circuit of claim 1, wherein a movable element associated with the first terminal of the one or more display units is configured to move to positions between a second terminal and a third terminal of the one or more display units until the voltage associated with the first terminal of the display units equals the voltage associated with the voltage reference source.

11. The circuit of claim 1, further comprising:
    a display including a plurality of display units;
    a processor that is configured to communicate with the display, the processor being configured to process image data; and
    a memory device that is configured to communicate with the processor.

12. The circuit of claim 11, further comprising:
    a driver circuit configured to send at least one signal to the display; and
    a controller configured to send at least a portion of the image data to the driver circuit.

13. The circuit of claim 11, further comprising:
    an image source module configured to send the image data to the processor, wherein the image source module comprises at least one of a receiver, transceiver, and transmitter.

14. The circuit of claim 11, further comprising:
    an input device configured to receive input data and to communicate the input data to the processor.

15. A system comprising:
    a measurement circuit including:
        an amplifier having a first input, a second input, and an output, the first input of the amplifier coupled with a voltage reference source, and
        a current source having an input and an output, the input of the current source coupled with the output of the amplifier, the output of the current source coupled with the second input of the amplifier, the current source being voltage controlled;
    one or more display units having a first terminal coupled with the second input of the amplifier and with the output of the current source, wherein the current source is configured to provide a current based on a voltage associated with the output of the amplifier, the current increasing until a voltage associated with the first terminal of the one or more display units equals a voltage associated with the voltage reference source, wherein the first terminal of the one or more display units is associated with a movable element, and the voltage reference source is configured to ramp through a voltage range associated with a travel range of the movable element;

an analog-to-digital converter (ADC) having an input coupled with the output of the amplifier, and an output to provide measurement data; and a memory configured to store the measurement data.

16. The system of claim 15, further comprising:

a microcontroller configured to analyze the measurement data.

17. A method for determining capacitance of a group of one or more display units, the method comprising:

ramping a reference voltage associated with a first input of an amplifier, the amplifier having a second input, and an output;

generating a current from a current source having an input and an output, the input of the current source coupled with the output of the amplifier, the output of the current source coupled with the second input of the amplifier, the current source being voltage controlled; and providing a voltage associated with a first terminal of the group of one or more display units, the first terminal coupled with the second input of the amplifier and with the output of the current source, wherein the current source provides a current based on a voltage associated with the output of the amplifier, the current increasing until the voltage associated with the first terminal of the one or more display units equals a voltage associated with the voltage reference source, wherein the first terminal of the group of one or more display units is associated with a movable element, and the reference voltage is ramped through a voltage range associated with a travel range of the movable element.

18. The method of claim 17, the method further comprising:

providing a feedback capacitor, the feedback capacitor having a first terminal coupled with the output of the current source and a second terminal coupled with the output of the amplifier.

19. The method of claim 18, the method further comprising:

changing a capacitance of the feedback capacitor based on a number of display units in the group of the one or more display units.

* * * * *